United States Patent
Wu et al.

(10) Patent No.: US 12,446,363 B2
(45) Date of Patent: *Oct. 14, 2025

(54) LIGHT-EMITTING STRUCTURE AND LIGHT-EMITTING DEVICE INCLUDING THE SAME

(71) Applicant: XIAMEN SANAN OPTOELECTRONICS TECHNOLOGY CO., LTD., Xiamen (CN)

(72) Inventors: Zheng Wu, Xiamen (CN); Chia-En Lee, Xiamen (CN); Chen-Ke Hsu, Xiamen (CN)

(73) Assignee: HUBEI SAN'AN OPTOELECTRONICS CO., LTD., Ezhou (CN)

( * ) Notice: Subject to any disclaimer, the term of this patent is extended or adjusted under 35 U.S.C. 154(b) by 515 days.

This patent is subject to a terminal disclaimer.

(21) Appl. No.: 17/939,300

(22) Filed: Sep. 7, 2022

(65) Prior Publication Data
US 2023/0006097 A1    Jan. 5, 2023

Related U.S. Application Data

(63) Continuation-in-part of application No. 16/895,119, filed on Jun. 8, 2020, now Pat. No. 11,456,400, which
(Continued)

(30) Foreign Application Priority Data
Dec. 11, 2017  (CN) .......................... 201711306978.0

(51) Int. Cl.
*H10H 20/819* (2025.01)
*H01L 21/683* (2006.01)

(52) U.S. Cl.
CPC ....... *H10H 20/819* (2025.01); *H01L 21/6835* (2013.01); *H01L 2221/68313* (2013.01);
(Continued)

(58) Field of Classification Search
CPC .......... H05K 3/20; H05K 3/305; H05K 1/112; H05K 2201/09036; H05K 2201/09472;
(Continued)

(56) References Cited

U.S. PATENT DOCUMENTS

| 11,456,400 B2 * | 9/2022 | Wu ...................... H01L 21/6835 |
| 2011/0169041 A1 * | 7/2011 | Bae ...................... H10H 20/854 |
| | | 257/99 |

(Continued)

FOREIGN PATENT DOCUMENTS

| CN | 105826435 | 8/2016 |
| CN | 106058010 | 10/2016 |

(Continued)

OTHER PUBLICATIONS

Search Report appended to an Office Action, which was issued to Chinese counterpart application No. 201711306978.0 by the CNIPA on Mar. 25, 2019, with an English translation thereof.
(Continued)

*Primary Examiner* — Mark W Tornow
*Assistant Examiner* — Priya M Rampersaud
(74) *Attorney, Agent, or Firm* — Thomas Horstemeyer, LLP

(57) ABSTRACT

Disclosed is a light-emitting structure including a light-emitting diode and a connecting unit. The light-emitting diode includes an epitaxial laminate, a first electrode, and a second electrode. The epitaxial laminate includes a first type semiconductor layer, a second type semiconductor layer, and a light-emitting layer. The connecting unit is connected to the epitaxial laminate.

19 Claims, 4 Drawing Sheets

Related U.S. Application Data is a continuation-in-part of application No. PCT/CN2018/085128, filed on Apr. 28, 2018.

(52) U.S. Cl.
 CPC ............... *H01L 2221/68354* (2013.01); *H01L 2221/68363* (2013.01)

(58) Field of Classification Search
 CPC ......... H05K 2201/10106; H05K 3/301; H05K 3/303; H05K 3/4092; H05K 3/4007; H05K 3/3436; H05K 3/40; H05K 1/111; H10H 20/857; H10H 20/819; H10H 20/01; H10H 20/036; H10H 20/8312; H10H 29/142; H10H 20/82; H10H 20/032; H10H 20/0364; H10H 20/83; H10H 20/85; H01L 25/0753; H01L 21/6835; H01L 2924/00; H01L 2221/68381; H01L 2221/68318; H01L 2221/68368; H01L 2221/68354; H01L 2221/6835; H01L 24/83; H01L 2924/12041; H01L 21/7806; H01L 2221/68322; H01L 2224/95001; H01L 2221/68363; H01L 2224/95136; H01L 2224/97; H01L 24/95; H01L 2224/83; H01L 24/97; H01L 21/67144; H01L 21/52; H01L 2221/68313; H01L 2221/68304; H01L 2224/02313; H01L 2224/03; H01L 2224/11; H01L 2224/13012; H01L 2224/94; H01L 24/32; H01L 24/08

See application file for complete search history.

(56) References Cited

U.S. PATENT DOCUMENTS

| | | | |
|---|---|---|---|
| 2012/0314388 A1* | 12/2012 | Bower | ..................... H05K 3/20 156/219 |
| 2016/0086855 A1* | 3/2016 | Bower | ................ H01L 21/6835 257/798 |
| 2016/0181488 A1* | 6/2016 | Saito | ..................... H10H 20/819 257/88 |
| 2017/0117257 A1* | 4/2017 | Lee | ........................ H10H 20/831 |
| 2017/0133818 A1* | 5/2017 | Cok | ........................ G02B 5/003 |
| 2018/0006186 A1* | 1/2018 | Bower | ............. H10H 20/01335 |
| 2018/0174910 A1* | 6/2018 | Bower | ................... H10D 86/01 |
| 2019/0051552 A1 | 2/2019 | Bower | |

FOREIGN PATENT DOCUMENTS

| | | |
|---|---|---|
| CN | 106941108 | 7/2017 |
| CN | 107170773 | 9/2017 |
| JP | H109148225 A | 6/1997 |
| WO | 2016184769 A1 | 11/2016 |

OTHER PUBLICATIONS

International Search Report for PCT/CN2018/085128 mailed Sep. 25, 2018.

* cited by examiner

LIGHT-EMITTING STRUCTURE AND LIGHT-EMITTING DEVICE INCLUDING THE SAME

CROSS-REFERENCE TO RELATED APPLICATION

This application is a continuation-in-part application of U.S. patent application Ser. No. 16/895,119 filed on Jun. 8, 2020, which is a bypass continuation-in-part application of International Application No. PCT/CN2018/085128 filed on Apr. 28, 2018, which claims priority of Chinese Patent Application No. 201711306978.0 filed on Dec. 11, 2017. The entire content of each of the international, Chinese, and U.S. patent applications is incorporated herein by reference.

FIELD

The disclosure relates to a light-emitting structure, and more particularly to a light-emitting structure including a light-emitting diode to be transferred. The disclosure also relates to a light-emitting device including the light-emitting structure.

BACKGROUND

Micro light-emitting diodes (mLEDs), which have advantages such as low power consumption, high brightness, very high dissolution and color saturation, fast response, low energy consumption, and long lifetime, etc., have been widely researched due to their potential as a next generation display light source. In addition, the power consumption of mLEDs is about 10% of that of liquid crystal displays (LCDs) and about 50% of that of organic light-emitting diodes (OLEDs). Furthermore, mLEDs have a brightness which is 30 times higher than that of OLEDs that are self-emissive like mLEDs, and a dissolution of 1500 PPI (pixels per inch). Since mLEDs has these significant advantages, they are promising as substitutes for presently used OLEDs and LCDs to become the next generation display light sources.

However, mLEDs have yet to be mass produced due to various technical difficulties. One of these difficulties is how to enhance the efficiency for transferring mLEDs.

SUMMARY

An object of the disclosure is to provide a solution to address the drawback of the prior art.

According to a first aspect of the disclosure, there is provided a light-emitting structure, which includes a light-emitting diode and a connecting unit. The light-emitting diode includes an epitaxial laminate, a first electrode, and a second electrode. The epitaxial laminate has an upper surface and a recess extending inwardly from the upper surface, and includes a first type semiconductor layer, a second type semiconductor layer, and a light-emitting layer interposed between the first type semiconductor layer and the second type semiconductor layer. The first electrode is electrically connected to the first type semiconductor layer, and the second electrode is electrically connected to the second type semiconductor layer. The connecting unit is connected to the epitaxial laminate.

According to a second aspect of the disclosure, there is provided a light-emitting device, which includes an outer support member and the light-emitting structure described above. The outer support member has an upper surface with an opening, and a receiving space extending inwardly from the opening. The light-emitting diode of the light-emitting structure is received in the receiving space and is spaced apart from the outer support member. The connecting unit is disposed on the upper surface of the outer support member to interconnect the light-emitting diode and the outer support member so as to permit the light-emitting diode to be suspended in the receiving space.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
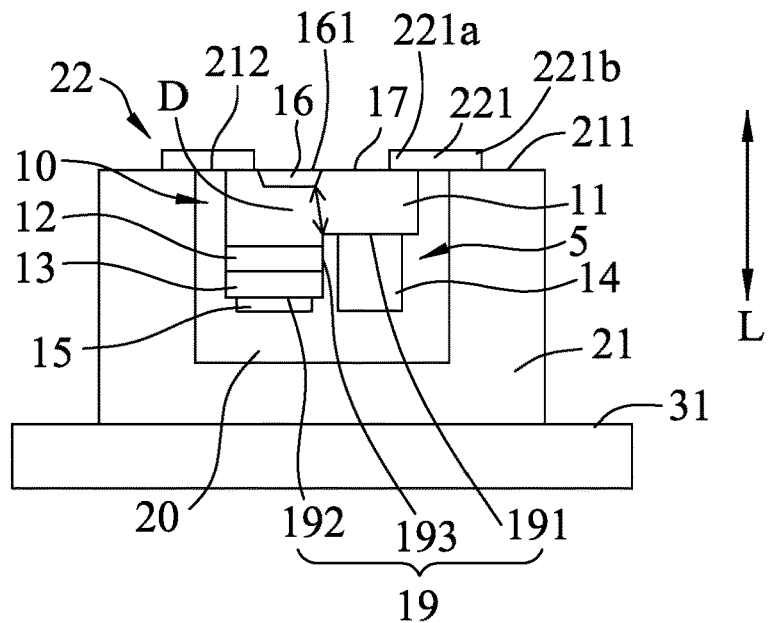
FIG. 1 is a schematic side view of a light-emitting device including an embodiment of a light-emitting structure according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

A light-emitting structure according to the disclosure includes a light-emitting diode and a connecting unit. The light-emitting diode includes an epitaxial laminate, a first electrode, and a second electrode. The epitaxial laminate has an upper surface and a recess extending inwardly from the upper surface, and includes a first type semiconductor layer, a second type semiconductor layer, and a light-emitting layer interposed between the first type semiconductor layer and the second type semiconductor layer. The first electrode is electrically connected to the first type semiconductor layer, and the second electrode is electrically connected to the second type semiconductor layer. The connecting unit is connected to the epitaxial laminate.

In certain embodiments, the connecting unit is connected to the upper surface of the epitaxial laminate.

In certain embodiments, the epitaxial laminate further has a lower surface opposite to the upper surface, and a lateral surface transverse to and interconnecting the upper and lower surfaces. The connecting unit is connected to the lateral surface of the epitaxial laminate.

In certain embodiments, the connecting unit includes at least two connecting members.

In certain embodiments, the connecting members are misaligned with the recess of the epitaxial laminate.

In certain embodiments, the connecting unit is made of a dielectric material. In certain embodiments, the dielectric material is $SiO_2$, $SiN$, $AlN$, $Al_2O_3$, or combinations thereof.

In certain embodiments, each of the connecting members includes a first end portion proximate to the recess and connected to the epitaxial laminate, and a second end portion distal from said recess and formed with a broken surface.

In certain embodiments, the epitaxial laminate further has a lower surface opposite to the upper surface. The lower surface has a first surface portion located at the first type semiconductor layer, a second surface portion located at the second type semiconductor layer, and a shoulder surface portion interconnecting the first surface portion and the second surface portion. The recess is misaligned with the first surface portion in a longitudinal direction transverse to the upper surface of the epitaxial laminate.

In certain embodiments, a shortest distance between the first surface portion and a bottom of the recess is up to 4 µm.

In certain embodiments, the recess has a roughened surface.

In certain embodiments, the recess has an opening with a center which is misaligned with a chip center in a longitudinal direction transverse to the upper surface of the epitaxial laminate.

In certain embodiments, the center of the opening of the recess is misaligned with a center of the upper surface of the epitaxial laminate in the longitudinal direction.

In certain embodiments, the recess has a depth ranging from 0.1 µm to 1.0 µm.

In certain embodiments, the recess extends convergingly from the upper surface of the epitaxial laminate.

In certain embodiments, the first and second electrodes are disposed on a same surface of the epitaxial laminate.

In certain embodiments, the light-emitting diode is a micro light-emitting diode having a chip size of up to 100 µm×100 µm.

In certain embodiments, the opening of the recess has an area ranging from 30% to 50% of an area of the upper surface of the epitaxial laminate.

A light-emitting device according to the disclosure includes an outer support member and the light-emitting structure described above. The outer support member has an upper surface with an opening, and a receiving space extending inwardly from the opening. The light-emitting diode of the light-emitting structure is received in the receiving space and is spaced apart from the outer support member. The connecting unit is disposed on the upper surface of the outer support member to interconnect the light-emitting diode and the outer support member so as to permit the light-emitting diode to be suspended in the receiving space.

In certain embodiments, the light-emitting diode is spaced apart from the outer support member in the longitudinal direction by a distance which is equal to at least a thickness of the connecting unit.

In certain embodiments, the light-emitting device further includes a substrate disposed beneath the outer support member.

Figure 2:
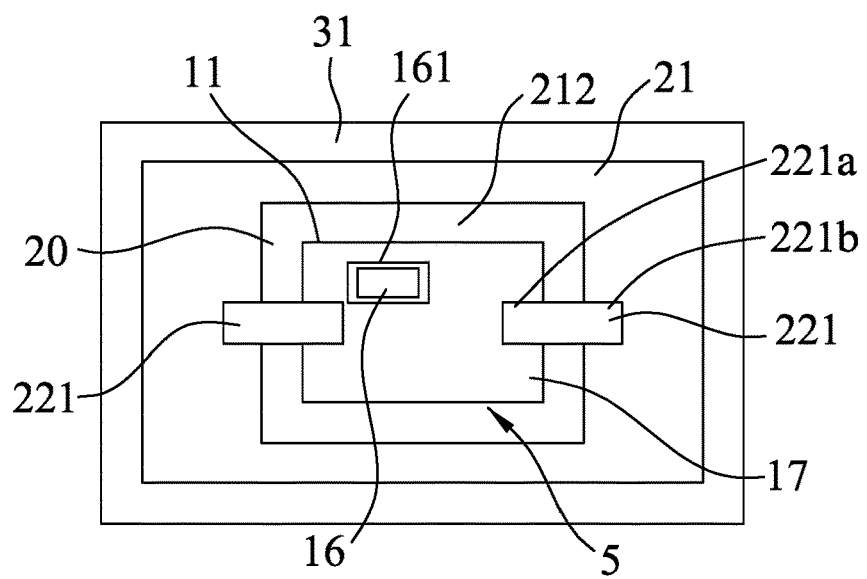
FIG. 2 is a schematic top view of the light-emitting device shown in FIG. 1.

Referring to FIGS. 1 and 2, an embodiment of a light-emitting structure according to the disclosure includes a light-emitting diode 5 and a connecting unit 22. The light-emitting diode 5 is received in an outer support member 21. Specifically, the outer support member 21 has an upper surface 211 with an opening 212, and a receiving space 20 extending inwardly from the opening 212. The light-emitting diode 5 is received in the receiving space 20 and is spaced apart from the outer support member 21.

The connecting unit 22 is disposed on the upper surface 211 of the outer support member 21 to interconnect the light-emitting diode 5 and the outer support member 21 so as to permit the light-emitting diode 5 to be suspended in the receiving space 20.

The light-emitting diode 5 is a micro light-emitting diode having dimensions of up to 100 µm×100 µm, and includes an epitaxial laminate 10, a first electrode 14, and a second electrode 15.

The epitaxial laminate 10 has an upper surface 17 and a recess 16 extending inwardly from the upper surface 17, and includes a first type semiconductor layer 11, a second type semiconductor layer 13, and a light-emitting layer 12. The light-emitting layer 12 is interposed between the first type semiconductor layer 11 and the second type semiconductor layer 13, and is distal from the upper surface 17.

The first electrode 14 is electrically connected to the first type semiconductor layer 11, and the second electrode 15 is electrically connected to the second type semiconductor layer 13. The first and second electrodes 14, 15 are disposed on a same surface of the epitaxial laminate 10. Alternatively, the first and second electrodes 14, 15 may be disposed on different surfaces of the epitaxial laminate 10 according to a specific configuration designed for the light-emitting diode 5. Specifically, the light-emitting diode 5 can be configured as a flip type structure, a face-up type structure, or a vertical type structure. In the flip and face-up type structures, the first and second electrodes 14, 15 are disposed on the same surface of the epitaxial laminate 10. In the vertical type structure, the first and second electrodes 14, 15 are disposed on the different surfaces of the epitaxial laminate 10.

The recess 16 is formed in the upper surface 17 of the epitaxial laminate 10, as described above, and is used for transferring the light-emitting diode 5. Alternatively, the recess 16 may be formed at different positions of other configurations designed for the light-emitting diode 5 to be transferred. For example, the recess 16 may be formed in the first electrode 14 of the light-emitting diode 5 configured as the vertical type structure, or in the substrate of the light-emitting diode 5 configured as the flip or face-up type structure.

Figure 3:
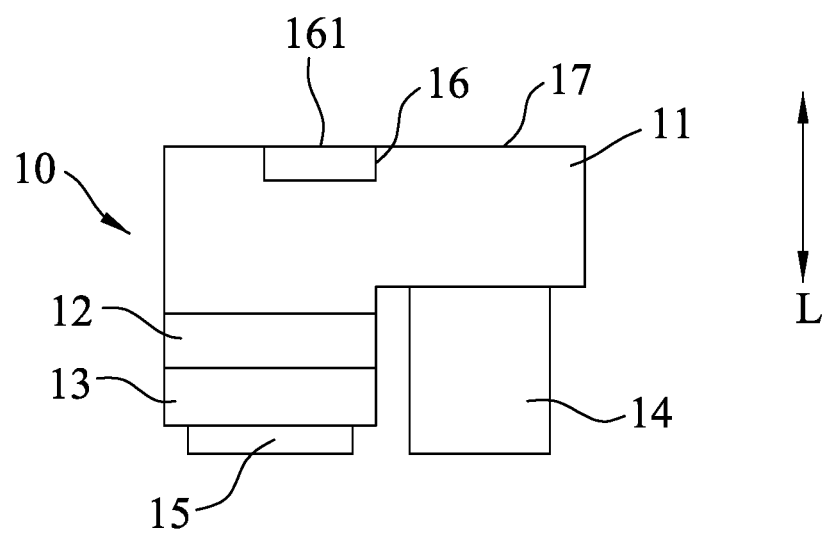
FIG. 3 is a schematic side view of a variant of the embodiment of the light-emitting structure.

The recess 16 extends convergingly from the upper surface 17 of the epitaxial laminate 10. Referring to FIG. 3, a variant of the embodiment of the light-emitting structure according to the disclosure is illustrated, in which the recess 16 has a lateral surface vertical to the upper surface 17 of the epitaxial laminate 10. It should be noted that the recess 16 may be formed as other geometries (for example, a cross-shaped geometry) in addition to those illustrated in FIGS. 1 to 3.

The recess 16 has an opening 161 with a center which is misaligned with a chip center in a longitudinal direction (L) transverse to the upper surface 17 of the epitaxial laminate 10, so as to produce a rotation torque during transfer of the light-emitting diode 5. Alternatively, the center of the opening 161 of the recess 16 may be misaligned with a center of the upper surface 17 of the epitaxial laminate 10 in the longitudinal direction (L), as shown in FIG. 1.

The opening 161 of the recess 16 has an area ranging from 30% to 50% of an area of the upper surface 17 of the epitaxial laminate 10. Furthermore, the recess 16 has a depth ranging from 0.1 µm to 1.0 µm.

The connecting unit 22 is connected to the epitaxial laminate 10. In certain embodiments, the connecting unit 22 is connected to the upper surface 17 of the epitaxial laminate 10, as shown in FIG. 1.

Figure 4:
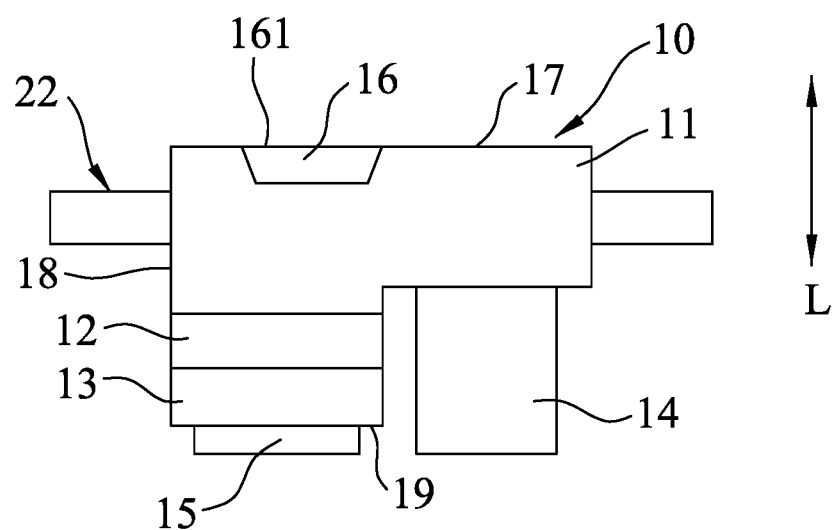
FIG. 4 is a schematic side view of another variant of the embodiment of the light-emitting structure.

Referring to FIG. 4, in another variant of the embodiment of the light-emitting structure according to the disclosure, the epitaxial laminate 10 of the light-emitting structure further has a lower surface 19 opposite to the upper surface 17, and a lateral surface 18 transverse to and interconnecting the upper and lower surfaces 17, 19. The connecting unit is connected to the lateral surface 18 of the epitaxial laminate 10.

Figure 5:
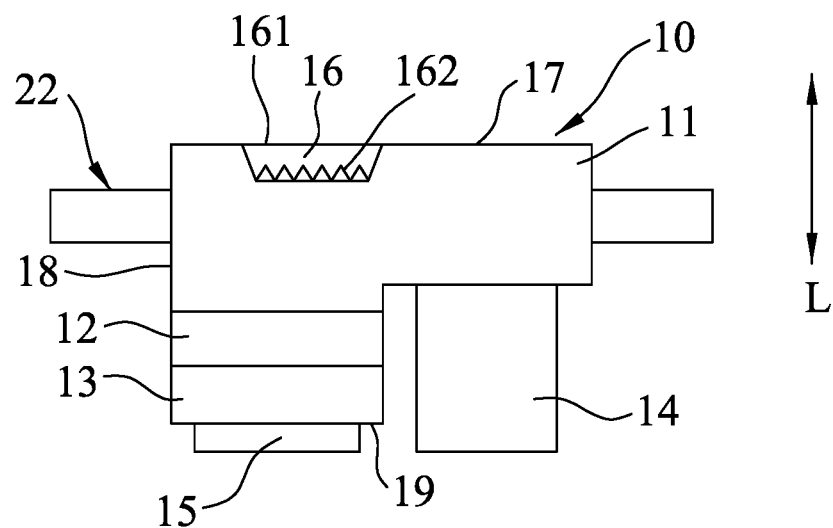
FIG. 5 is a schematic side view of a further variant of the embodiment of the light-emitting structure.

Referring to FIG. 5, in a further variant of the embodiment of the light-emitting structure according to the disclosure, the recess 16 may have a roughened surface 162 (for example, but not limited to, a surface formed with a plurality of protrusions).

Referring again to FIGS. 1 and 2, as described above, the outer support member 21 has the upper surface 211 with the opening 212, and the receiving space 20 extending inwardly from the opening 212. The outer support member 21 has a height ranging from 1 µm to 20 µm, and is made of an inert material, such as a benzocyclobutene adhesive, an ultraviolet adhesive, a resin, or combinations thereof. In addition, a substrate 31 is disposed beneath the outer support member 21 so as to avoid deformation of the outer support member 21. The substrate 31 may be a sapphire sheet, a silicon sheet, a metal sheet, or the like.

The light-emitting diode 5 is received in the receiving space 20, and is spaced apart from the outer support member 21 so as to provide a buffer space for picking up the light-emitting diode 5 from the receiving space 20 during transfer of the light-emitting diode 5.

The connecting unit 22 includes at least two connecting members 221 which provide a bonding strength sufficient to bond the light-emitting diode 5 to permit the light-emitting diode 5 to be suspended in the receiving space 20. When the connecting unit 22 is configured as a single connecting member 221, the bonding strength provided by the connecting member 221 may be insufficient for suspending the light-emitting diode 5 in the receiving space 20. Otherwise, the connecting member 221 should have a relatively large size to provide sufficient bonding strength, so that the connecting member 221 would not be easily broken during transfer of the light-emitting diode 5. Each of the connecting members 221 includes a first end portion 221a proximate to the recess 16 and connected to the epitaxial laminate 10, and a second end portion 221b distal from said recess 16.

When the connecting unit 22 is configured as two connecting members 221, as illustrated in FIG. 2, a width of each of the connecting members 221 is in a range from 8% to 20% of that of a corresponding side of the light-emitting diode 5. When each of the connecting members 221 has a width in such range, the connecting members 221 can provide sufficient bonding strength for suspending the light-emitting diode 5 in the receiving space 20, and can be broken easily so as to transfer the light-emitting diode 5.

As described above, the recess 16 has a depth ranging from 0.1 µm to 1.0 µm, and the center of the opening 161 of the recess 16 is misaligned with the center of the upper surface 17 of the epitaxial laminate 10 in the longitudinal direction (L). In addition, the connecting members 221 are misaligned with the recess 16 of the epitaxial laminate 10, as shown in FIG. 2, so as to produce a rotation torque for breaking the connecting members 221 easily such that the light-emitting diode 5 can be transferred from the receiving space 20 of the outer support member 21.

In order to break the connecting unit 22 easily, the connecting unit 22 is made of a dielectric material with brittleness. Examples of the dielectric material may include, but are not limited to, $SiO_2$, $SiN$, $AlN$, $Al_2O_3$, and combinations thereof.

In addition, the lower surface 19 of the epitaxial laminate 10 has a first surface portion 191 located at the first type semiconductor layer 11, a second surface portion 192 located at the second type semiconductor layer 13, and a shoulder surface portion 193 interconnecting the first surface portion 191 and the second surface portion 192. The recess 16 is formed to be misaligned with the first surface portion 191 in the longitudinal direction (L) transverse to the upper surface 17 of the epitaxial laminate 10 so as to prevent the epitaxial laminate 10 from breaking during formation of the recess 16. When the recess 16 is misaligned with the first surface portion 191 in the longitudinal direction (L), a shortest distance (D) between the first surface portion 191 and a bottom of said recess 16 is up to 4 µm.

The light-emitting diode 5 is spaced apart from the outer support member 21 in the longitudinal direction (L) by a distance which is equal to at least a thickness of the connecting unit 22, so as to avoid damage of the light-emitting diode 5 during breaking of the connecting unit 22.

Figure 6:
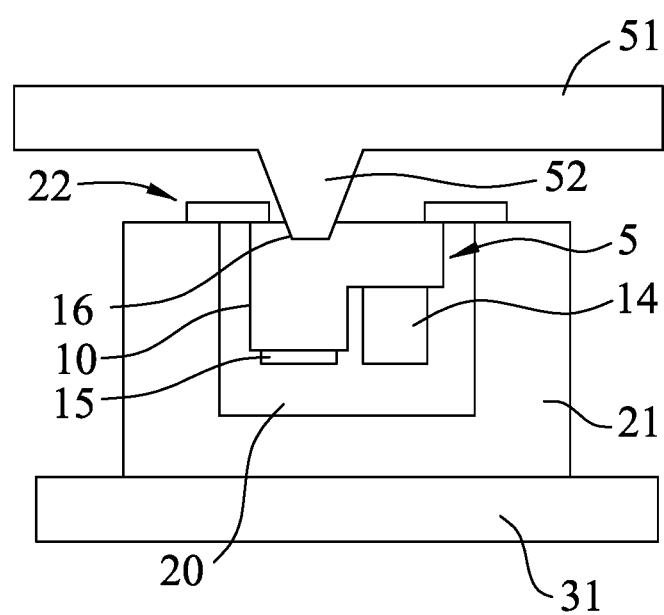
FIG. 6 is a schematic side view illustrating a method for transferring a light-emitting diode of the embodiment of the light-emitting structure.
Figure 7:
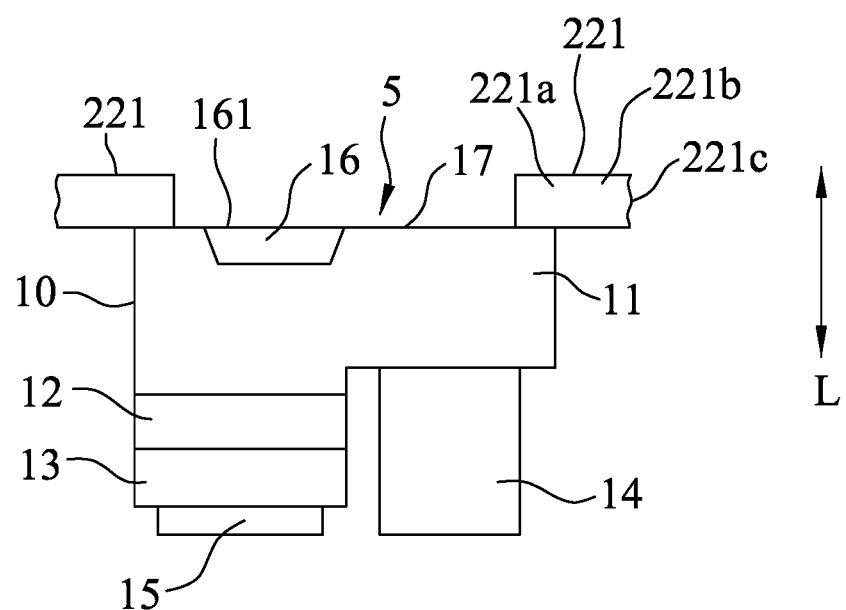
FIG. 7 is a schematic side view of the embodiment of the light-emitting structure after being transferred.

Referring to FIGS. 6 and 7, which illustrate a method for transferring the light-emitting diode 5. An adhesive protrusion 52 of a transfer member 51 is inserted into the recess 16 of the epitaxial laminate of the light-emitting diode 5 to permit the adhesive protrusion 52 to adhere to the light-emitting diode 5. The connecting unit 22 is broken such that the light-emitting diode 5 is separated from the outer support member 21 and is transferred from the outer support member 21 by the transfer member 51. After the connecting unit 22 is broken, the second end portion 221b of each of the connecting members 221 is formed with a broken surface 221c.

The transfer member 51 is made of an adhesive material, such as polydimethylsiloxane, silicone, a thermal release adhesive, an ultraviolet adhesive, or combinations thereof.

Since only the adhesive protrusion 52 of the transfer member 51 is inserted into the recess 16 of the epitaxial laminate 10 of the light-emitting diode 5 to permit the adhesive protrusion 52 to adhere to the light-emitting diode 5, the transfer member 51 can be easily separated from the light-emitting diode 5 after the light-emitting diode 5 is transferred.

In addition, when the recess 16 is formed with the roughened surface 162 as shown in FIG. 5, a contact area and a van der Waals force between the epitaxial laminate 10 of the light-emitting diode 5 and the adhesive protrusion 52 of the transfer member can be increased, such that an adhering effect between the epitaxial laminate 10 of the light-emitting diode 5 and the adhesive protrusion 52 of the transfer member 51 can be enhanced when the light-emitting diode 5 is transferred by the transfer member 51.

In view of the aforesaid, the epitaxial laminate of the light-emitting diode is provided with the recess which can be inserted by the adhesive protrusion of the transfer member to permit the adhesive protrusion to adhere to the light-emitting diode. Therefore, the light-emitting diode can be transferred by the transfer member effectively, thereby enhancing the transfer efficiency and the reliability of the light-emitting diode.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting structure, comprising:
    a light-emitting diode including:
        an epitaxial laminate having an upper surface and a recess extending inwardly from said upper surface, said epitaxial laminate including
            a first type semiconductor layer,
            a second type semiconductor layer, and
            a light-emitting layer interposed between said first type semiconductor layer and said second type semiconductor layer,
        a first electrode electrically connected to said first type semiconductor layer, and
        a second electrode electrically connected to said second type semiconductor layer; and
    a connecting unit connected to said epitaxial laminate, wherein said epitaxial laminate further has a lower surface opposite to said upper surface, said lower surface having a first surface portion located at said first type semiconductor layer, a second surface portion located at said second type semiconductor layer, and a shoulder surface portion interconnecting said first surface portion and said second surface portion, said recess being misaligned with said first surface portion in a longitudinal direction transverse to said upper surface of said epitaxial laminate.

2. The light-emitting structure according to claim 1, wherein said connecting unit is connected to said upper surface of said epitaxial laminate.

3. The light-emitting structure according to claim 1, wherein said epitaxial laminate further has a lower surface opposite to said upper surface, and a lateral surface transverse to and interconnecting said upper and lower surfaces, said connecting unit being connected to said lateral surface of said epitaxial laminate.

4. The light-emitting structure according to claim 1, wherein said connecting unit includes at least two connecting members.

5. The light-emitting structure according to claim 4, wherein said connecting members are misaligned with said recess of said epitaxial laminate.

6. The light-emitting structure according to claim 1, wherein said connecting unit is made of a dielectric material selected from the group consisting of $SiO_2$, SiN, AlN, $Al_2O_3$, and combinations thereof.

7. The light-emitting structure according to claim 4, wherein each of said connecting members includes a first end portion proximate to said recess and connected to said epitaxial laminate, and a second end portion distal from said recess and formed with a broken surface.

8. The light-emitting structure according to claim 1, wherein a shortest distance between said first surface portion and a bottom of said recess is up to 4 μm.

9. The light-emitting structure according to claim 1, wherein said recess has a roughened surface.

10. The light-emitting structure according to claim 1, wherein said recess has an opening with a center which is misaligned with a chip center in a longitudinal direction transverse to said upper surface of said epitaxial laminate.

11. The light-emitting structure according to claim 10, wherein said center of said opening of said recess is misaligned with a center of said upper surface of said epitaxial laminate in the longitudinal direction.

12. The light-emitting structure according to claim 1, wherein said recess has a depth ranging from 0.1 μm to 1.0 μm.

13. The light-emitting structure according to claim 1, wherein said recess extends convergingly from said upper surface of said epitaxial laminate.

14. The light-emitting structure according to claim 1, wherein said first and second electrodes are disposed on a same surface of said epitaxial laminate.

15. The light-emitting structure according to claim 1, which said light-emitting diode is a micro light-emitting diode having a chip size of up to 100 μm×100 μm.

16. The light-emitting structure according to claim 10, wherein said opening of said recess has an area ranging from 30% to 50% of an area of said upper surface of said epitaxial laminate.

17. A light-emitting device, comprising:
    an outer support member having
        an upper surface with an opening, and
        a receiving space extending inwardly from said opening; and
    the light-emitting structure according to claim 1, wherein said light-emitting diode of said light-emitting structure is received in said receiving space and spaced apart from said outer support member, and
    said connecting unit is disposed on said upper surface of said outer support member to interconnect said light-emitting diode and said outer support member so as to permit said light-emitting diode to be suspended in said receiving space.

18. The light-emitting device according to claim 17, wherein said light-emitting diode is spaced apart from said outer support member in a longitudinal direction transverse to said upper surface of said epitaxial laminate by a distance which is equal to at least a thickness of said connecting unit.

19. The light-emitting device according to claim 17, further comprising a substrate disposed beneath said outer support member.

* * * * *